United States Patent
White et al.

(10) Patent No.: US 9,171,793 B2
(45) Date of Patent: Oct. 27, 2015

(54) SEMICONDUCTOR DEVICE HAVING A TRACE COMPRISES A BEVELED EDGE

(75) Inventors: Lawrence H. White, Corvallis, OR (US); Robel Vina, Corvallis, OR (US); Terry Momahon, Albany, OR (US); James R. Przybyla, Philomath, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1189 days.

(21) Appl. No.: 13/116,670

(22) Filed: May 26, 2011

(65) Prior Publication Data

US 2012/0299186 A1 Nov. 29, 2012

(51) Int. Cl.
*H01L 23/48* (2006.01)
*H01L 23/552* (2006.01)
*H01L 23/52* (2006.01)
*H01L 21/00* (2006.01)
*H01L 23/498* (2006.01)
*H01L 21/768* (2006.01)
*H01L 23/00* (2006.01)

(52) U.S. Cl.
CPC .... *H01L 23/49822* (2013.01); *H01L 21/76838* (2013.01); *H01L 24/03* (2013.01); *H01L 24/05* (2013.01); *H01L 2224/0235* (2013.01); *H01L 2224/0239* (2013.01); *H01L 2224/02381* (2013.01); *H01L 2224/05013* (2013.01); *H01L 2224/05024* (2013.01); *H01L 2224/05092* (2013.01); *H01L 2224/05553* (2013.01); *H01L 2224/45124* (2013.01); *H01L 2924/00014* (2013.01); *H01L 2924/1461* (2013.01)

(58) Field of Classification Search
CPC ................. H01L 21/76838; H01L 23/49822; H01L 24/03; H01L 24/05; H01L 2924/00014; H01L 2924/014; H01L 2924/1461
USPC ................. 257/761, 618, 623, 774, E23.011, 257/E21.159, 777, 786, 660; 438/656, 124, 438/669; 174/262
See application file for complete search history.

(56) References Cited

U.S. PATENT DOCUMENTS

| | | | |
|---|---|---|---|
| 6,165,886 A | 12/2000 | Lin et al. | |
| 6,548,224 B1 | 4/2003 | Chen et al. | |
| 6,649,987 B1 * | 11/2003 | Staker et al. | 257/417 |
| 7,071,564 B1 * | 7/2006 | Erb et al. | 257/774 |

(Continued)

OTHER PUBLICATIONS

Y. Li, et al., "Impact of IC Wafer Fab and Assembly Fab Processes on Package Stress Induced product Reliability Issues—An Insight Into the Package Stress Relief Design Rules by Simulation", IEEE CFP08RPS—CDR 46th Annual International Reliability Physics Symposium, Phoenix, 2008, pp. 455-461, 978-1-4244-2050-6/08.

*Primary Examiner* — Long K Tran
*Assistant Examiner* — Dzung Tran
(74) *Attorney, Agent, or Firm* — Thorpe, North & Western, L.L.P.

(57) ABSTRACT

A semiconductor device can include a substrate and a trace layer positioned in proximity to the substrate and including a trace for supplying an electrical connection to the semiconductor device. Conductive layers can be positioned in proximity to the trace layer and form a bond pad. A non-conductive thin film layer can be positioned between the trace layer and the conductive layers. The thin film layer can include a via to enable the electrical connection from the trace to the bond pad. A portion of the trace between the substrate and the plurality of conductive layers can have a beveled edge.

16 Claims, 4 Drawing Sheets

(56) References Cited

U.S. PATENT DOCUMENTS

| | | | |
|---|---|---|---|
| 7,071,654 B2* | 7/2006 | Suzuki et al. | 320/133 |
| 7,528,069 B2 | 5/2009 | Wenzel et al. | |
| 2001/0033021 A1* | 10/2001 | Shimoishizaka et al. | 257/737 |
| 2005/0079705 A1* | 4/2005 | Takeuchi | 438/637 |
| 2005/0205978 A1* | 9/2005 | Pu et al. | 257/678 |
| 2006/0043156 A1* | 3/2006 | Debelius et al. | 228/180.22 |
| 2006/0214266 A1* | 9/2006 | Jordan | 257/618 |
| 2007/0155174 A1* | 7/2007 | Taniguchi et al. | 438/667 |
| 2010/0038124 A1* | 2/2010 | Liu et al. | 174/262 |
| 2010/0140759 A1* | 6/2010 | Pagaila et al. | 257/660 |

* cited by examiner

SEMICONDUCTOR DEVICE HAVING A TRACE COMPRISES A BEVELED EDGE

BACKGROUND

An integrated circuit (IC) typically is an electronic circuit manufactured by diffusion of metal elements into the surface of a semiconductor material. Integrated circuits are used in various electronic devices today. Computers, cellular phones, and so forth are some example devices which include integrated circuits and which have been made possible, at least in part, due to low cost of production of such circuits.

For many applications, IC chips are packaged before being placed on circuit boards. Materials used in chip manufacturing and packaging have different properties and behaviors, and various temperature changes and mechanical stresses can lead to stress or damage in an end product. For example, stresses can cause damage to the IC chip. In particular, certain stresses can cause cracks in the IC chip, or more specifically, in a layer of passivation within the IC chip.

Various attempts have been made to identify specific causes of such stresses and to address ways to avoid the stresses. For example, some package stress relief designs restrict the use of the areas which are more heavily affected by stress. Some attempts to reduce stress have proposed the use of various different materials or the use of defined packaging methods, such as wire bonding and tape automated bonding, including single-point thermosonic bonding and gang or thermocompression bonding. Different types of bonds or packaging can have a different effect on the stresses on the chip. However, some designs still exhibit areas of high stress with resultant cracking.

DETAILED DESCRIPTION

Reference will now be made to the examples illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

Integrated circuits (ICs) or dies can be fabricated using various layers and materials to make specific electrical circuit components and provide functions for a semiconductor device. Layers for an IC can include metal layers for capacitors and connecting circuits, dielectric or insulation layers for capacitors and transistors and electrical insulation between conducting layers, diffusion layers for forming transistors, protection or passivation layers to protect the circuit from the environment, and/or a resistive layer for heat generation.

Figure 1:
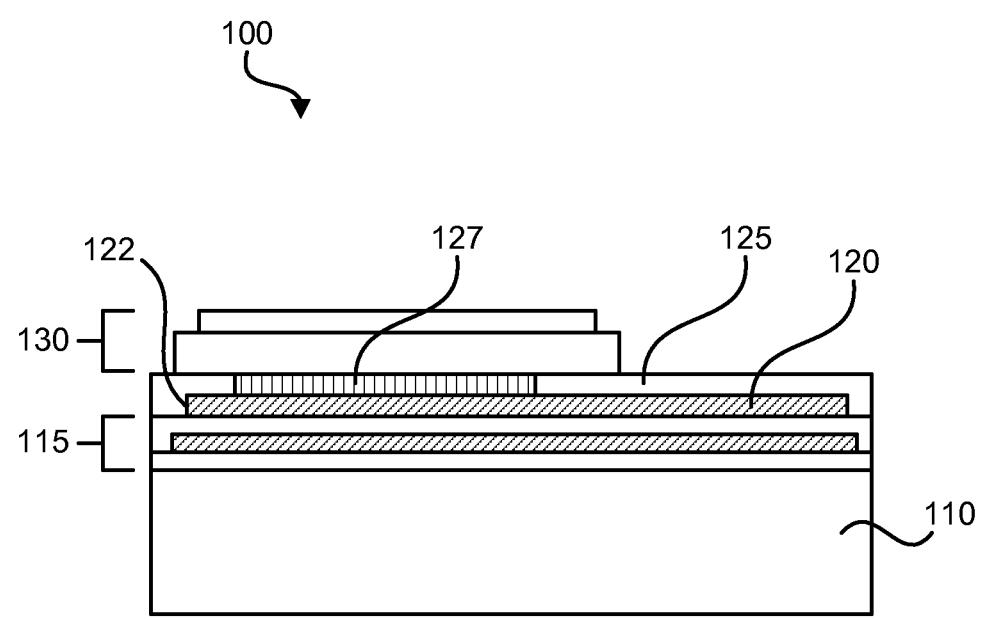
FIG. 1 is an example side view of a semiconductor device including a bond pad.

Semiconductor devices are often fabricated in large numbers and small sizes. To facilitate electrical connections to the semiconductor devices, bond pads or bonding pads are fabricated for or with the semiconductor device. A bond pad is a metallized area on the surface of a semiconductor device to which connections can be made. FIG. 1 illustrates an example semiconductor device 100 including a bond pad 130. The device includes a substrate 110 upon which various layers 115, 120, 125 are formed. For example, the layers can include a desired number of dielectric and metallic layers. At least one of the metallic layers can be a metal wire or trace 120 which is connected to metal layers forming the bond pad. A passivation layer 125 can be formed between the trace and the bond pad. The bond pad and the trace can be interconnected by etching one or more holes, called vias 127, in the passivation layer. A metal, such as tungsten, can be deposited in the via, or alternatively, at least one of the metal layers forming the bond pad can be allowed to fill the via as the metal layer is deposited.

As shown in FIG. 1, the metal trace 120 extends under the bond pad 130 above. Due to packaging and other stresses, as well as softness of the metal used in the bond pad above the trace, one or more metal layers and/or dielectric layers in the bond pad can crack and fail. Also, FIG. 1 illustrates a square-ended metal trace 122. The squared trace end can lead to stress concentration on the passivation layer 125, which can cause dielectric or metal cracking and failure.

Figure 2A:
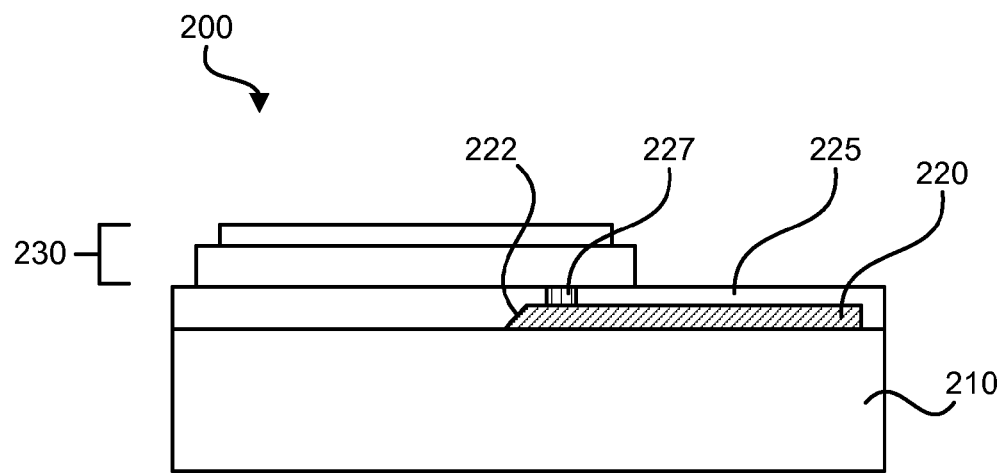
FIG. 2a is a side view of a semiconductor device including a beveled trace in accordance with an example of the present technology.

FIG. 2a illustrates an example semiconductor device 200 having features which result in a more reliable device due to decreased stresses and chances of cracking and failure. The device of FIG. 2a includes a substrate 210. The substrate can include silicon, gallium arsenide, or other elements and compounds used in semiconductor wafers and dies. A plurality of layers 220, 225, 230 can be formed on the substrate. For example, the layers can be formed using various deposition, etching, and/or lithography techniques. As specific and non-limiting examples of fabrication methods, various metal, dielectric, and other layers may be deposited using sputtering or evaporation processes, physical vapor deposition, chemical vapor deposition, electrochemical deposition, molecular beam epitaxy, and/or atomic layer deposition. Photolithography and masks may be used to pattern dopants and other layers. Photolithography may be used to protect or expose a pattern to etching which can remove material from the conductive or metal layer, the resistive layer, the dielectric layer, the passivation layer, the polymer layer, and other layers. Etching may include wet etching, dry etching, chemical-mechanical planarization (CMP), reactive-ion etching (RIE), deep reactive-ion etching (DRIE), etc. Etching may be isotropic or anisotropic. The resulting features from deposition and etching of layers can be resistors, capacitors, sensors, contact pads, wires, traces, and so forth that can connect devices and resistors together.

A trace layer 220 can be formed or positioned in proximity to the substrate 210. The trace layer can include a metallic trace for supplying an electrical connection to the semiconductor device 200. For simplicity, FIG. 2a illustrates the trace layer being formed directly on the substrate. However, in practice, and as shown in FIG. 2b, the device can include any suitable number of intervening layers 215.

Figure 2B:
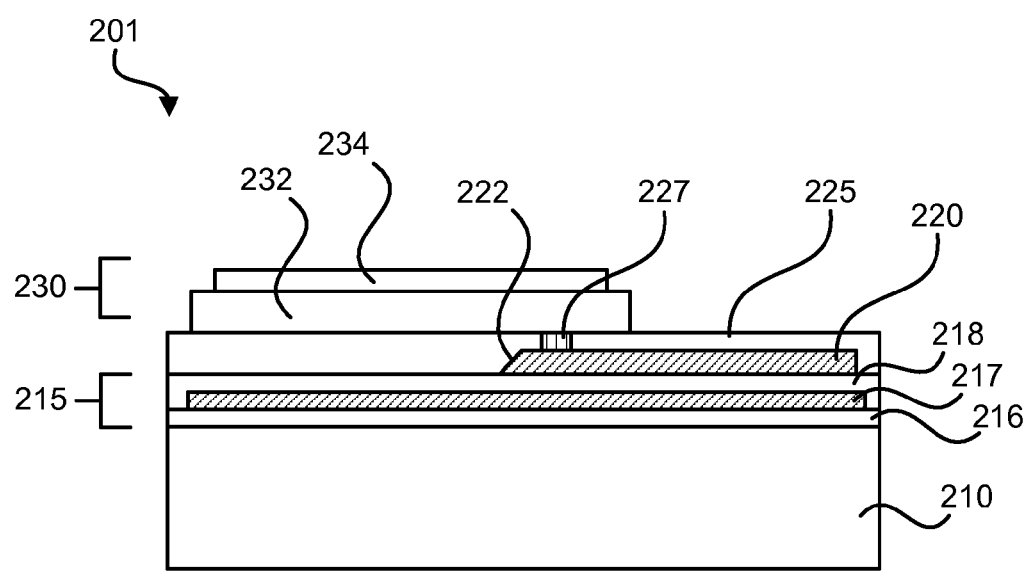
FIG. 2b is a side view of a semiconductor device including a beveled trace and a plurality of layers intervening between the trace and a substrate in accordance with an example of the present technology.

FIG. 2b illustrates an example configuration where the device 201 includes a plurality of dielectric layers 216, 218 and an additional metallic layer 217 intervening between the trace layer and the substrate. The dielectric layers can include any of a variety of different dielectric materials individually or in combination. Some example dielectric layers include silicon, such as in silicon dioxide, tetraethyl orthosilicate, silicate glass (including undoped silicate glass, phospho-silicate glass, boro-silicate glass, and boro-phospho-silicate glass), silicon oxycarbide, silicon carbide, silicon nitride, and so forth. Some other examples include aluminum oxide and hafnium oxide. The dielectric layers may be selected according to a desired dielectric constant, typically between about 2.0 and 4.0.

The metallic trace 225 can include a suitable material, such as aluminum or copper. In one example, the trace layer can be deposited as a blanket film of aluminum. The aluminum film can be patterned and etched to form one or more isolated wires as the trace. For simplicity, the wire remaining as the trace can be considered the trace can be considered to be the trace layer unless otherwise indicated. For some applications, aluminum may result in timing delays and the trace can be formed of copper. Devices including copper traces can be formed using damascene processing, such as single or double damascene processing. In some examples damascene processing can eliminate one or more processing steps and provide certain efficiencies over processing of aluminum wires.

At least a portion of the trace 225 can be beveled. In other words, the trace can include a beveled edge 222. Integration of bond pad designs with micro-electro-mechanical systems (MEMS) structures often involves covering a thick metal trace layer with a thin dielectric or passivation layer. In fabrication of at least some of these devices, a photo sequence is used to create certain device features. For example, when the semiconductor device includes a thermal inkjet resistor, a photo sequence can be performed during fabrication to create resistor bevels. This existing photo sequence can be simultaneously used to bevel a leading edge of the metal trace to prevent or limit cracking in the passivation layer. Such a sequence or process can be used to bevel the trace whether or not a device fabrication process already includes the sequence or process. In one example, a dry resistor etch (DRE) mask can be applied to bevel the trace(s). In the example including the thermal inkjet resistors, a DRE mask can be used to bevel traces and create thermal inkjet resistor bevels substantially simultaneously. Where a process exists in device fabrication for beveling another part of the device, beveling of the trace can be accomplished without significant expenditures of time or money in retooling, reprogramming, or otherwise changing the fabrication process. Essentially, the change can be implemented with a one-time cost and effort in creating a photo mask which includes the beveling of the trace.

A mask can be applied after deposition of the trace to create beveled edges about a perimeter of openings in the trace film. In one example, the mask can create a beveled edge at one end of the trace. In another example, application of the mask can result in beveling of a plurality of edges of the trace. The bevel can be created in a variety of configurations. For example, the bevel can be a curved bevel or a straight bevel. The bevel can be angled anywhere between 5° and 90° with respect to a plane of the substrate or with respect to a plane of an intervening layer between the trace and the substrate. For example, the bevel may be angled at 15°, 30°, 45°, 60°, or 75°. FIGS. 2a-2b illustrate a trace 220 with a beveled edge 222 beveled at approximately 45° with respect to a plane of the substrate 210.

With the mask in place, a bevel can be etched into the trace using a suitable metal etchant that acts upon exposed portions of the trace material and not upon the mask. As described above, the etchant can work upon the plane of the trace to etch the trace at an angle. The etching process can continue with the trace etched downwardly at an angle until a desired depth is reached. The photomask can maintain the boundaries of the trace as well as protect the underlying layers and/or components from potentially deleterious effects of the etchant.

A non-conductive thin film layer, or passivation layer 225, can be formed over the trace layer 220. The passivation layer can include a dielectric material. In more specific examples, the passivation layer can include a deposit of silicon nitride and/or silicon carbide. A via 227 can be etched through the passivation layer to the trace. A metal, such as tungsten, can then be deposited in the via, such as by using a sputtering or evaporation process. Alternatively, the via can be filled by the metal of one of the metal layers of the bond pad when the metal is deposited to form a layer of the bond pad. A plurality of conductive layers 232, 234 can be positioned in proximity the trace layer to form the bond pad 230. For example, the passivation layer can be interposed between the trace layer and the plurality of conductive layers. An electrical connection is enabled between the trace and the bond pad by the via through the passivation layer.

In more detailed examples, the bond pad can have width and length dimensions of approximately 100×200 μm. The plurality of conductive layers forming the bond pad can include two layers. A first or lower layer, being closer to the passivation layer, may comprise tantalum. A second or upper layer may comprise gold. The first layer can prevent degradation of the passivation layer that might occur if the passivation layer were directly exposed to the metal etching or other fabrication processes that defines the second layer contact pad. The first and second layers can be rectangularly shaped. The first layer can have a larger circumference than the second layer. For example, the first layer can have a width and/or length at least approximately 6 μm greater than the width and/or length of the second layer. The second layer can be centered over the first layer, at least in one direction, such that the lower layer extends at least approximately 3 μm past the edges of the second layer on either side of the second layer in the at least one direction when viewed from above.

Figure 3:
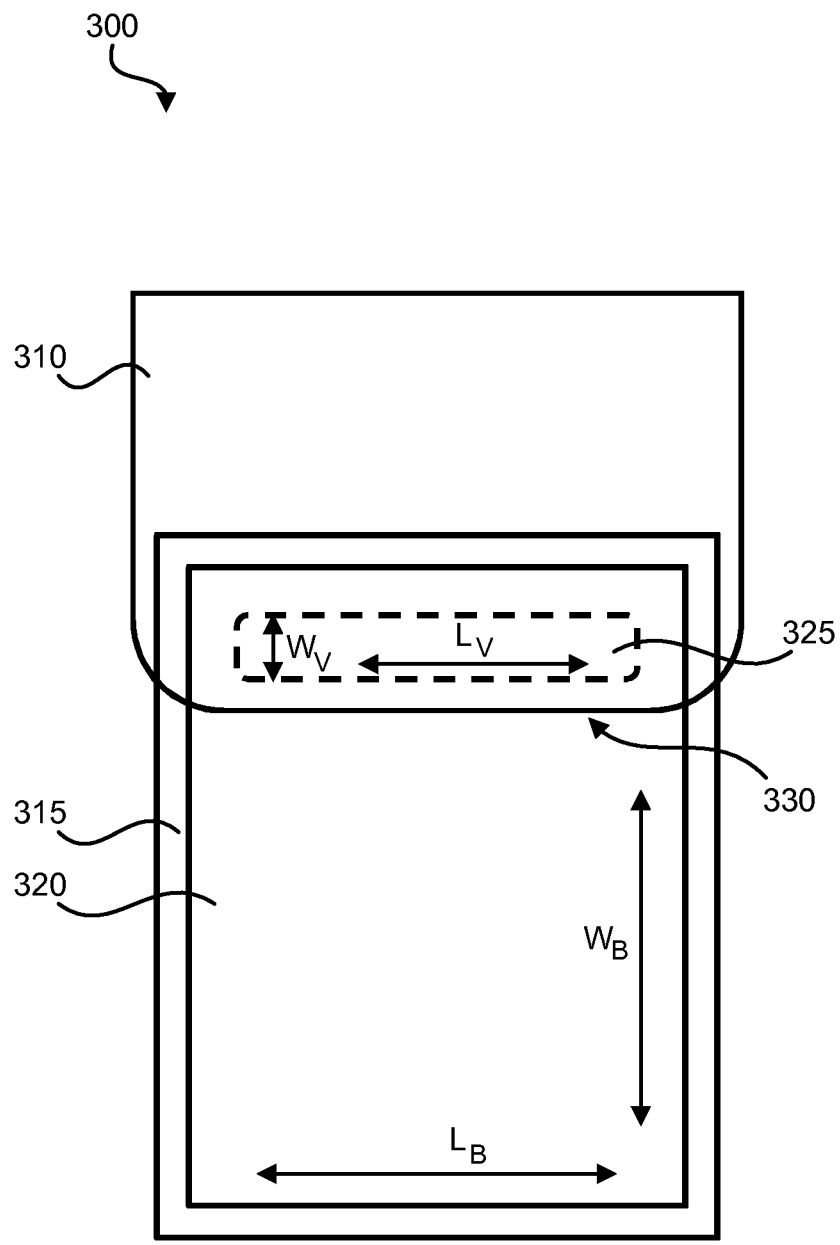
FIG. 3 is a top view of a semiconductor device in accordance with an example of the present technology.

Referring to FIG. 3, a top view of a semiconductor device 300 is illustrated which includes a substrate having a plurality of layers thereon including a trace layer 310, and a bond pad (including layers 315, 320) formed above the plurality of layers. The bond pad includes two rectangularly shaped layers, a lower layer 315 of which has a larger circumference than an upper layer 320 thereof. Some devices can include a via which extends beneath a majority of a length of a bond pad (see 127 of FIG. 1, for example). However, as illustrated in FIGS. 2a-2b and FIG. 3, the present device can include a via 325 which has a length greater than a width. In other words, the via can be positioned in proximity to a side of the bond pad and comprise a via length $L_V$ (in the length direction of the bond pad $L_B$) extending along the side of the bond pad which is greater than a width $W_V$ of the via (in the width direction of the bond pad $W_B$). Also, FIG. 3 illustrates a point 330 at which the trace terminates with respect to the bond pad. In various implementations, the trace can be formed at least as wide as the via, or wider or more narrow than the bond pad. FIG. 3 illustrates an example where the trace is wider than the via and also wider than the bond pad. The trace can extend beneath the bond pad along a fraction of a length of the bond pad. For example, the trace can extend along less than ½ of the bond pad length $L_B$, or less than ⅓, ¼, ⅕, or 1/10 of the bond pad length $L_B$. To the extent the trace extends beneath the bond pad, the via can be appropriately sized, shaped, and/or positioned to enable electrical connection between the trace and the bond pad. In one aspect, the via can be etched with a rectangle, oval, circle, or polygonal shape with squared and/or rounded corners.

Figure 4:
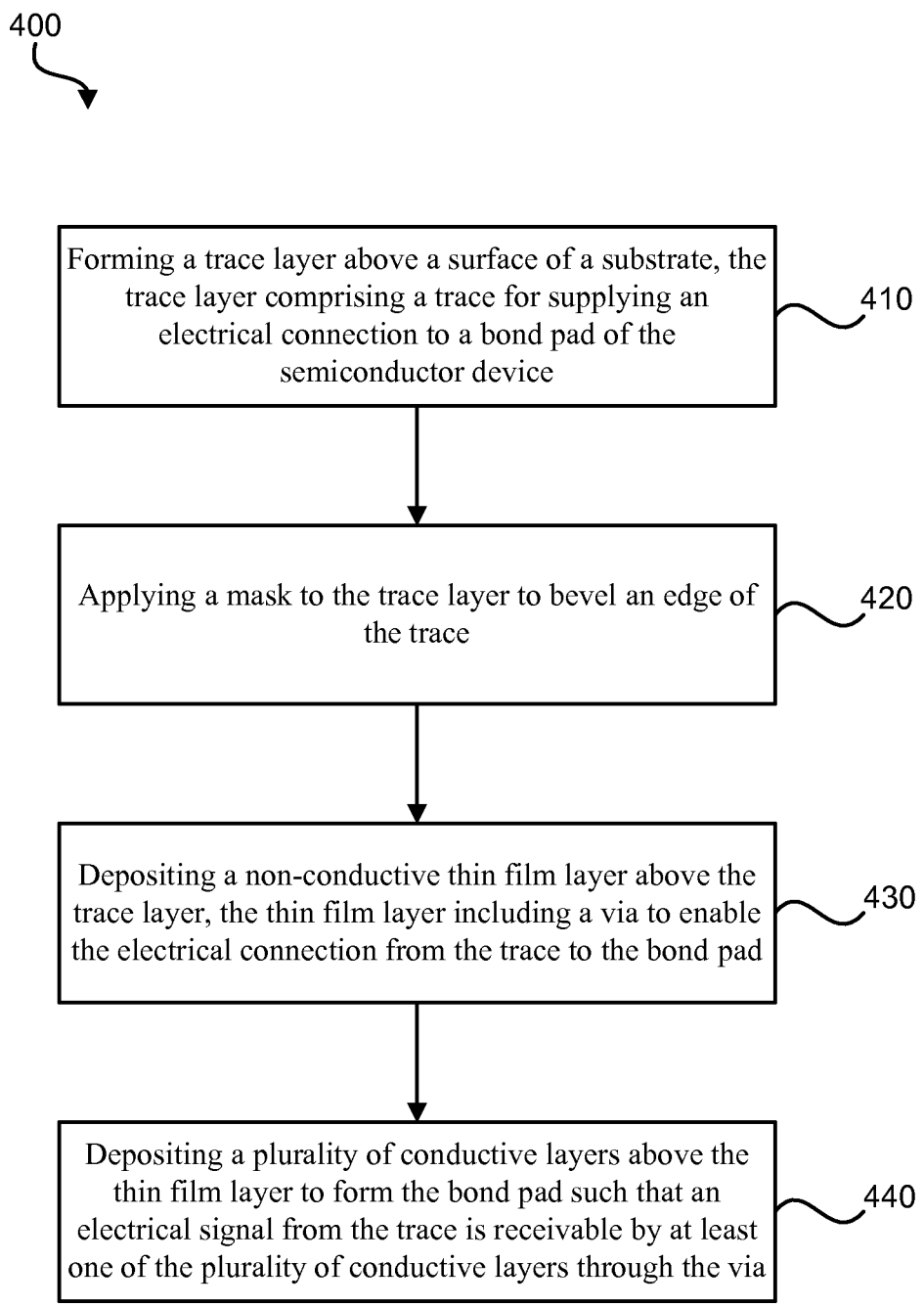
FIG. 4 is a flow diagram of a method of forming a semiconductor device in accordance with an example of the present technology.

Referring to FIG. 4, a flow diagram of a method 400 of forming a semiconductor device is shown in accordance with an example. The method can include forming 410 a trace layer above a surface of a substrate, the trace layer comprising a trace for supplying an electrical connection to a bond pad of the semiconductor device. A mask can be applied 420 to the trace layer to bevel an edge of the trace. In one aspect, a plurality of edges of the trace can be beveled using the mask.

A non-conductive thin film layer can be deposited 430 above the trace layer. The thin film layer can include a via to enable the electrical connection from the trace to the bond pad. The method can further include depositing 440 a plurality of conductive layers above the thin film layer to form the bond pad such that an electrical signal from the trace is receivable by at least one of the plurality of conductive layers through the via. In one aspect, the conductive layers forming the bond pad can be formed by depositing a tantalum layer and subsequently depositing a gold layer. The gold layer can be deposited with a smaller surface area than a surface area of the tantalum layer.

The method can include forming the via in the thin film layer by etching an elongate area proximate to a side of at least one of the plurality of conductive layers. The method can include forming the trace layer by depositing aluminum as the trace from a location not between the substrate and the bond pad (or where the bond pad will be subsequently formed) to a location between the substrate and an edge of the bond pad as illustrated in FIGS. 2a-3. The location between the substrate and the edge of the bond pad can be at a point less than half of a length of the bond pad or less than a fourth of a length of the bond pad, etc.

In some examples, the semiconductor device can include transistor and/or resistor components formed in or with the substrate or layers above the substrate. For example, the substrate can include a transistor gate, source, and drain. A first dielectric layer can be deposited over and isolate the transistor gate, source, drain and substrate. The first dielectric layer can be patterned and etched to provide one or more openings to enable a subsequently deposited metal layer to contact the transistor source, drain, and gate, as well as the substrate.

A first metal layer including one or more metals can be deposited over the first dielectric layer. The first metal layer can be patterned using a photomask and subsequently etched for the purpose of providing resistive and conductive material for other layers such as heat transducer and/or conductive layers. In a specific example, the first metal layer can include metals deposited in sequence using a same metal deposition tool, with a resistive material comprising tantalum aluminide and a conductive material comprising an aluminum copper alloy. A mask can be applied to the first metal layer to pattern the first metal layer to form a trace.

A second dielectric layer can be deposited over the first metal layer. The second dielectric layer can be patterned and etched to provide one or more openings to enable a subsequently deposited metal layer to contact the first metal layer. A second metal layer can be deposited over the second dielectric layer. The second metal layer, or trace layer, can include, for example, a layer of aluminum. A mask and metal etchant can be applied to form the trace wire(s), as well as to bevel an edge of the trace.

A layer of passivation material can be deposited, which can cover and protect the trace. The passivation layer can be applied over the second metal layer and the second dielectric layer and extends near the second dielectric layer edges.

After the passivation layer is applied, a long, narrow via can be formed through the passivation layer. Metal layers such as those described above can be deposited and etched over the passivation layer.

There may be many other possible variations available for fabricating the device and device components. Such variations and adaptations are also contemplated and considered within the scope of this disclosure.

Although the foregoing description has focused primarily on the production and product of semiconductor devices using aluminum traces and also of semiconductor devices for use in thermal inkjet printing, it will be appreciated that the present invention may also be applied to the production of semiconductor devices using different materials and used for any of a variety of applications, including but not limited to aerosols suitable for pulmonary delivery of medicine, scent delivery, dispensing precisely controlled amounts of pesticides, paints, fuels, etc.

By arranging a trace to extend under one end of a bond pad as opposed to extending under substantially an entire length of the bond pad, cracking in the bond pad can be prevented or reduced. Also, where an end of a trace underlying a bond pad is squared, pressure from the bond can be concentrated and result in passivation cracking. However, by beveling an end of the trace (before depositing a passivation layer), pressure from the bond can be reduced. Thus, likelihood of passivation cracking is similarly reduced.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

The invention claimed is:

1. A semiconductor device, comprising:
a substrate;
a trace layer positioned in proximity to the substrate and including a trace for supplying an electrical connection to the semiconductor device;
a plurality of conductive layers positioned in proximity the trace layer forming a bond pad, the bond pad positioned so that the trace layer extends under one end of the bond pad but does not extend under substantially an entire length of the bond pad;
a non-conductive thin film layer positioned between the trace layer and the plurality of conductive layers, the thin film layer having a via to enable the electrical connection from the trace to the bond pad; and
wherein a portion of the trace between the substrate and the plurality of conductive layers comprises a beveled edge extending along an outer edge of the trace, wherein the beveled edge is at a location between the substrate and the bond pad.

2. A device as in claim 1, wherein the plurality of conductive layers comprises a layer of gold and a layer of tantalum.

3. A device as in claim 2, wherein the tantalum layer comprises a larger surface area than the gold layer.

4. A device as in claim 1, wherein the trace comprises aluminum.

5. A device as in claim 1, wherein the via is positioned in proximity to a side of the bond pad and comprises a length extending along the side of the bond pad greater than a width of the via.

6. A device as in claim 1, wherein the trace extends between the substrate and the plurality of conductive layers and extends along less than half of a length of at least one of the plurality of conductive layers.

7. A device as in claim 1, wherein the beveled edge comprises a 45° bevel.

8. A method of forming the semiconductor device of claim 1, comprising:
   forming the trace layer above a surface of the substrate, the trace layer comprising the trace for supplying the electrical connection to the bond pad of the semiconductor device;
   applying a mask to the trace layer to bevel an edge of the trace to form the beveled edge;
   depositing the non-conductive thin film layer above the trace layer, the thin film layer including the via to enable the electrical connection from the trace to the bond pad; and
   depositing the plurality of conductive layers above the thin film layer to form the bond pad such that an electrical signal from the trace is receivable by at least one of the plurality of conductive layers through the via.

9. A method as in claim 8, wherein applying the mask further comprises applying a mask to the trace layer to bevel a plurality of edges of the trace.

10. A method as in claim 8, wherein depositing the plurality of conductive layers comprises depositing a tantalum layer and subsequently depositing a gold layer.

11. A method as in claim 10, wherein depositing the gold layer comprises depositing a smaller surface area than a surface area of the tantalum layer.

12. A method as in claim 8, wherein forming the trace layer comprises depositing aluminum as the trace from a location not between the substrate and the bond pad to a location between the substrate and an edge of the bond pad.

13. A method as in claim 8, further comprising forming the via in the thin film layer by etching an elongate area proximate to a side of at least one of the plurality of conductive layers.

14. The semiconductor device of claim 1, wherein the beveled edge of the trace layer includes a curvature at corners of the trace layer.

15. The semiconductor device of claim 1, wherein the beveled edge extends along an entire width of the trace layer.

16. The semiconductor device of claim 1, wherein the trace layer comprises a smaller outer circumference than the substrate.

* * * * *